United States Patent [19]

Hayashi et al.

[11] Patent Number: 5,009,928
[45] Date of Patent: Apr. 23, 1991

[54] METHOD FOR FORMING A TRANSPARENT CONDUCTIVE METAL OXIDE FILM

[75] Inventors: Yutaka Hayashi, Ibaraki; Atuo Itoh, Tokyo; Mizuho Imai, Tokyo; Hideyo Iida, Tokyo, all of Japan

[73] Assignees: Japan as represented by general director of Agency of Industrial Science and Technology; Taiyo Yuden Co., Ltd.; Research Development Corporation of Japan, all of Tokyo, Japan

[21] Appl. No.: 498,038

[22] Filed: Mar. 23, 1990

[30] Foreign Application Priority Data

Mar. 31, 1989 [JP] Japan .................................. 1-80956

[51] Int. Cl.$^5$ .......................... B05D 5/12; C03C 17/23
[52] U.S. Cl. ................................. 427/126.3; 427/109; 427/110; 427/126.2; 427/166; 427/168; 427/314; 427/419.3; 427/419.2; 427/226; 65/60.2; 65/60.51; 65/60.53
[58] Field of Search .................. 427/126.3, 419.3, 166, 427/126.2, 314, 168, 165, 108, 109, 110, 226, 419.2, 427; 65/60.2, 60.51, 60.53

[56] References Cited

U.S. PATENT DOCUMENTS

| | | | |
|---|---|---|---|
| 4,329,379 | 5/1982 | Terneu et al. | 427/166 |
| 4,548,836 | 10/1985 | Middleton et al. | 427/160 |
| 4,571,350 | 2/1986 | Parker et al. | 427/109 |
| 4,788,079 | 11/1988 | Lindner | 427/166 |

FOREIGN PATENT DOCUMENTS 62-64007  3/1987  Japan ................................ 427/419.3

Primary Examiner—Shrive Beck
Assistant Examiner—Roy V. King
Attorney, Agent, or Firm—Flynn, Thiel, Boutell & Tanis

[57] ABSTRACT

This invention relates to a method for forming a transparent conductive metal oxide film having good characteristic properties. The method comprises feeding an atomized or gasified starting material onto a substrate to form a metal oxide film on the substrate, wherein the substrate is heated to form a first metal oxide film having a good degree of orientation of crystals and a second film formation step wherein a second metal oxide film is formed on the first metal oxide film under higher substrate temperature conditions than those in the first film formation step to form a second metal oxide film having a degree of orientation of crystals in conformity with that of the first metal oxide film.

11 Claims, 2 Drawing Sheets

METHOD FOR FORMING A TRANSPARENT CONDUCTIVE METAL OXIDE FILM

BACKGROUND OF THE INVENTION

1. Field of the Invention

This invention relates to a method for forming a metal oxide film having good characteristic properties.

2. Description of the Related Art

For the formation of metal oxide films which are used in solar cells or liquid crystal displays e.g. a transparent conductive film formed on a substrate, there are known several methods wherein such films are formed on a heated substrate by so-called CVD methods, spray methods and vacuum deposition methods. As the transparent conductive film formed on the substrate by such methods as mentioned above, there have been widely employed thin films mainly composed of tin oxide, which has good electric characteristics. This thin film has utility as a transparent electrode for electronic parts or devices.

The formation method of the transparent conductive film is particularly described with respect to the case where a transparent electrode used in solar cells is formed. Initially, there is provided a soda lime glass substrate on which a film of silicon dioxide ($SiO_2$) has been formed on the surface. Separately, a solution of starting materials for the film is provided wherein stannic chloride ($SnCl_4 \cdot 5H_2O$) and ammonium fluoride ($NH_4F$) or antimony chloride ($SbCl_3$) is dissolved in water. Also, there is provided a film formation apparatus which includes a means for keeping and heating the substrate, a means of spraying the solution, and a means for feeding the spray.

The substrate is set in the film formation apparatus wherein it is heated to a temperature of about 400° C. and the spray of the starting solution is released against the surface of the substrate for a given time thereby forming a film of tin oxide on the substrate surface. Thereafter, the substrate is removed from the apparatus.

The substrate temperature at which the film is formed has a great influence on the electrical and physical characteristics of the formed transparent conductive film. More particularly, when the substrate temperature is high, the specific resistance, which is one of the electric characteristics of the film, lowers and the light transmittance, which is one of the physical characteristics of the film, becomes better. Although a diffraction intensity of the (100) plane on the X-ray diffraction pattern chart is recognized, the crystals of the film grow in random directions. Such a transparent conductive film has a low degree of orientation of the crystals, so that the light transmitted through the film is not repeatedly reflected at the interface with a semiconductive film having the photoelectric conversion action and thus, the film becomes poor in the action of confining the light therein. Accordingly, such a transparent conductive film is not suitable for use as a transparent electrode for solar cell. On the other hand, when the substrate temperature is low at the time of the film formation, the resultant film has a good degree of orientation of the crystals with an increasing action of confining the light in the semiconductive film. However, the specific resistance, which is one of the electric characteristics of the transparent conductive film, increases with a lowering of light transmittance, which is one of the physical characteristics. When measured by means of an X-ray diffractometer, such a film has a large diffraction intensity at the (200) plane.

The substrate temperature of 400° C., which has been used in known film formation procedures, is selected in consideration of the relation between the substrate temperature during the formation of the film and the characteristics of the formed transparent conductive film. In the prior art formation methods of metal oxide films, it has been considered necessary to carefully control the substrate temperature within a narrow range in the vicinity of 400° C. and to form a metal oxide film on the substrate.

The chemical vapor deposition process, wherein a gasified starting material is supplied onto the substrate to form a metal oxide film, also involves similar problems although a desirable range of the substrate temperature differs from that used in the afore-described methods.

Even when, however, the metal oxide film is formed on the substrate while precisely controlling the substrate temperature, the optical, electric and physical characteristics of the formed metal oxide film, more or less, suffer the influences of the substrate temperature. If the thus formed metal oxide film is used as a transparent conductive film, the specific resistance of the oxide film is usually low and it has a good light transmittance, but there is an attendant problem that the formed film is poor in degree of orientation.

SUMMARY OF THE INVENTION

It is accordingly an object of the invention to provide a method for forming a metal oxide film which overcomes the problems of the prior art.

The above object can be achieved, according to the invention, by a method for forming a metal oxide film wherein a starting solution is sprayed and fed onto a heated substrate or a starting gas is fed onto a heated substrate to form a metal oxide film, the method comprising heating the substrate such that the resultant metal oxide film will have a good degree of orientation and further applying a spray of the solution or the starting gas under different substrate temperature conditions to form another metal oxide film on the first-mentioned film, so that the another metal oxide film has a degree of orientation in conformity with the degree of orientation of the first-mentioned film.

According to the method of the invention, the substrate temperature at the initial stage of the formation of the film is suppressed, so that the crystal planes of the formed film grow spirally thereby giving a good degree of orientation. Especially, when the metal oxide film is a tin oxide film, the temperature range within which there is obtained a film with a good degree of orientation is from 350 to 450° C. when a sprayed material is transferred onto the substrate and from 350 to 420° C. when a gasified material is fed onto the substrate. When another film is formed on the first-mentioned film at a higher substrate temperature, the resultant crystals are oriented according to the crystals of the lower film. This makes a textured film surface, so that the transmitted light is repeatedly reflected into the semiconductive film which has an action of photoelectric conversion with an increasing action of confining the light therein. In addition, the film has a low specific resistance as an electric characteristic and a good light transmittance as a physical characteristic.

The above and other objects, features and advantages of the present invention will become more apparent from the following description taken in conjunction with the accompanying drawings.

DESCRIPTION OF THE PREFERRED EMBODIMENT

Preferable embodiments of the formation method of a metal oxide film according to the invention are particularly described.

EXAMPLE 1

Figure 1:
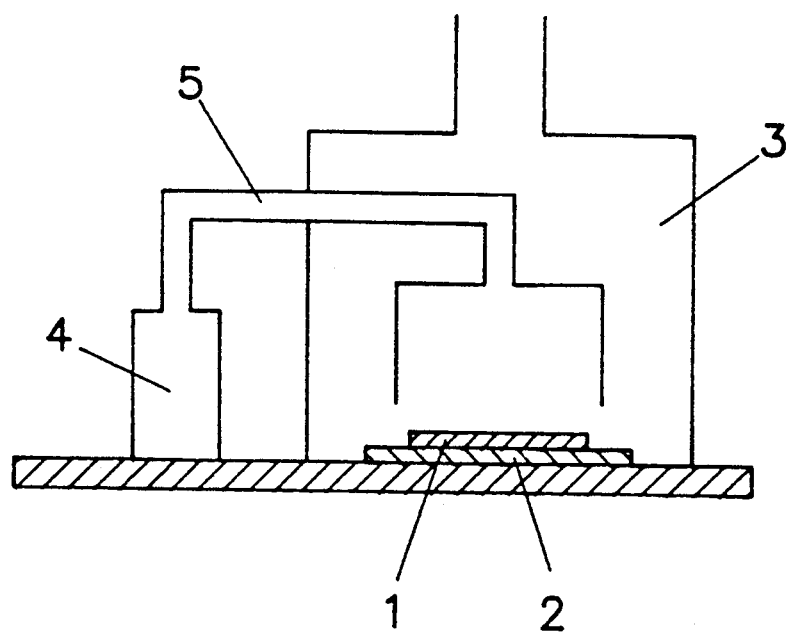
FIG. 1 is a schematic illustrative view of an apparatus for carrying out the method of the invention.

A film formation apparatus using a spraying technique, which was used in this example, is described with reference to FIG. 1.

This apparatus includes a film formation chamber 3 provided with a heating plate 2 for heating a substrate 1, and an atomizing unit 4 for atomizing a starting solution. The atomizing unit 4 and the film formation chamber 3 are connected through a pipe 5, and the starting solution is atomized in the atomizing unit 4 and is passed into the film formation chamber 3 wherein the atomized solution is contacted with the heated substrate 1 in the chamber 3, thereby forming a film on the substrate 1.

The substrate 1 used was a soda lime glass substrate on which a silicon dioxide film had been preliminarily formed. 25 g of stannic chloride ($SnCl_4 \cdot 5H_2O$) and 200 mol% of ammonium fluoride ($NH_4F$) relative to the tin atom were, respectively, weighed and dissolved in 150 ml of water, to which 10 ml of ethyl alcohol was further added, followed by agitation, to obtain a starting solution.

After the provision of the substrate 1 and the starting solution, the substrate 1 was placed on the heating plate 2 in the film formation chamber 3 of the film formation apparatus. The substrate 1 was heated on the plate 2 to have and maintain a surface temperature of 400° C. On the other hand, the starting solution was placed in the spraying unit 4 wherein it was atomized and sprayed onto the substrate 1 maintained at a surface temperature of 400° C., thereby forming an $SnO_2$ film.

The $SnO_2$ film formed in this stage had a thickness of about 1500 angstroms.

Subsequently, the atomization or spraying in the atomizing unit 4 was stopped, under which the substrate was allowed to stand in the film formation chamber 3, and the temperature of the heating plate 2 was increased so that the surface temperature of the substrate was raised to 530° C. and maintained at this level. In this condition, the atomized solution in the atomizing unit 4 was applied onto the substrate whose surface temperature was maintained at 530° C. to form a transparent conductive film.

By the formation of the transparent conductive film by in two stages, the total thickness of the formed film reached 5000 angstroms. The specific resistance of the $SnO_2$ film was found to be $6 \times 10^{-4}$ $\Omega \cdot cm$ and the overall transmittance was 77%.

As a result of the X-ray diffraction analysis of the film, only a diffraction peak of the (200) plane of $SnO_2$ was observed.

EXAMPLE 2

The general procedure of Example 1 was repeated except that antimony chloride ($SbCl_3$) used instead of $NH_4F$ as being dissolved in the starting solution, the amount of Sb atom relative to Sn atom was 3 mol%, and the substrate temperature at the formation of the first transparent electrode film was changed from 400° C. to 420° C., thereby forming a transparent conductive film. The specific resistance of the thus formed $SnO_2$ film was $1 \times 10^{-3}$ $\Omega \cdot cm$ and its overall transmittance was 82%.

As a result of the X-ray diffraction analysis of the film, only a diffraction peak of the (200) plane of $SnO_2$ was observed.

EXAMPLE 3

The general procedure of Example 1 was repeated except that the substrate temperature at the time of formation of the first transparent conductive film was 450° C. instead of 400° C. As a result, the specific resistance of the $SnO_2$ film was $5 \times 10^{-4}$ $\Omega \cdot cm$ and the overall transmittance was 78%.

As a result of the X-ray diffraction analysis of the film, only a diffraction peak of the (200) plane of $SnO_2$ was observed.

EXAMPLE 4

The general procedure of Example 1 was repeated except that the substrate temperature at the time of formation of the second transparent conductive film was 480° C. instead of 530° C. As a result, the specific resistance of the $SnO_2$ film was $7 \times 10^{-4}$ $\Omega \cdot cm$ and the overall transmittance was 77%.

As a result of the X-ray diffraction analysis of the film, only a diffraction peak of the (200) plane of $SnO_2$ was observed.

EXAMPLE 5

Figure 2:
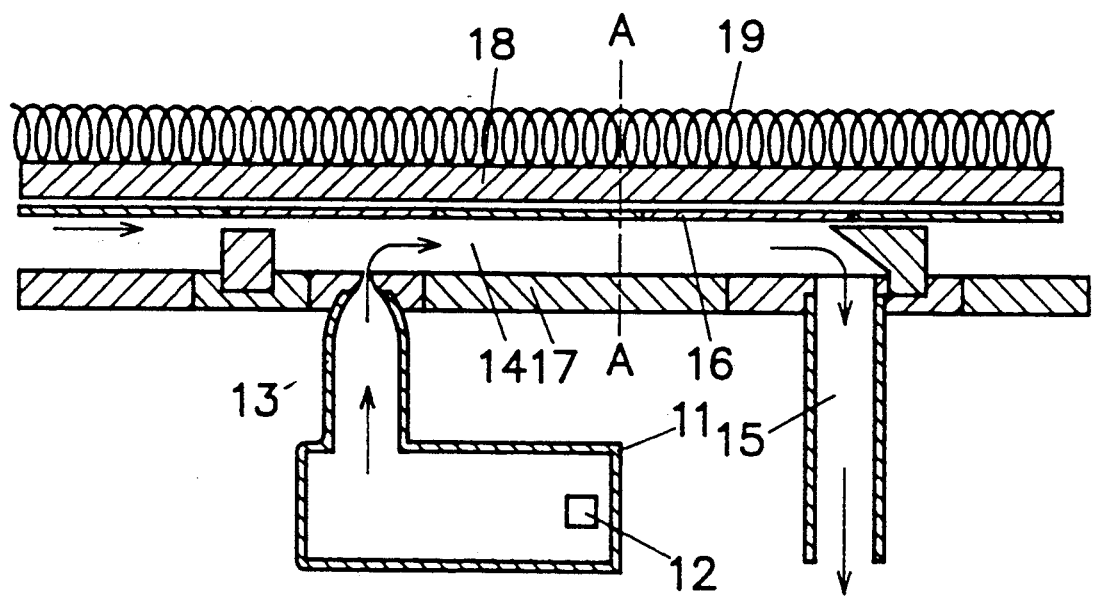
FIG. 2 is a schematic side view, in cross section, of another apparatus for carrying out the method of the invention.

A film formation apparatus was used which had a tunnel furnace capable of heating and feeding a substrate. This type of film formation apparatus is described with reference to FIGS. 2 and 3. The apparatus has an atomizer 11 for atomizing a starting solution by means of a sprayer 12. At the upper portion of the atomizer 11 is provided a nozzle 13 for film formation through which the atomized solution is released, and the nozzle is opened at the left side of the film formation chamber 14 as viewed in FIG. 2. An exhaust duct 15 is provided at the right side of the film formation chamber 14, by which the atomized solution fed from the atomizer 11 is passed from the nozzle 13 through the film formation chamber 14 and discharged from the exhaust duct 15.

Figure 3:
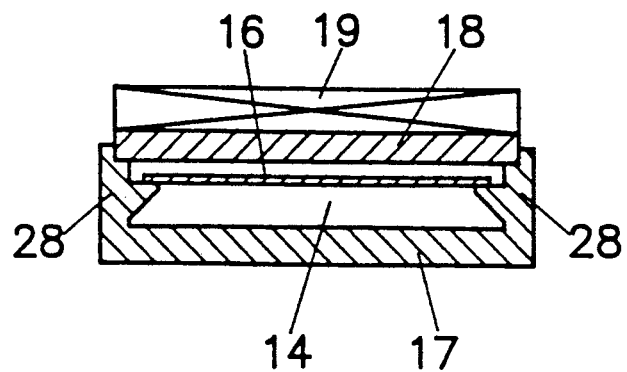
FIG. 3 is a section taken along line A—A of FIG. 2.

As is shown in the sectional view of FIG. 3, the film formation chamber 14 is in the form of a continuous tunnel-like passage which is defined by a furnace floor 17 and side walls 28, 28 to close the bottom and both sides thereof. At opposite sides of the side walls 28, 28, there are provided chin-shaped projections for holding a substrate 16 at opposite sides thereof. The held substrate 16 is used as an upper side of the film formation chamber 14 to complete the tunnel. The substrate 16 is arranged in a row and is fed at a given speed in the direction shown in FIG. 2. On the substrate 16 are provided a soaking plate 18 and a heater 19, and the substrate 16 is heated through the soaking plate 18 by means of the heater 19.

In this example, the temperature of the substrate 16 was so set as to be 450° C. in the vicinity of the nozzle 13 and to be 530° C. in the vicinity of the spray inlet of the exhaust duct 15. Accordingly, the temperature of the substrate 16 was 450° C. at the initial stage of forming the tin oxide film. As the substrate 16 is moved toward the right, as viewed in FIG. 2, its temperature is gradually increased to a maximum level of 530° C. at the last stage of film formation. The substrate 16 used was a glass substrate as used in Example 1 and an atomized solution was fed from the nozzle 13 toward the substrate 16, so that a film of tin oxide was formed on the surface of the substrate 16.

The thickness of the thus formed film was about 5000 angstroms and only a diffraction peak of the (200) plane of $SnO_2$ was observed. The specific resistance was $5 \times 10^{-4}$ $\Omega \cdot cm$ and the overall transmittance was 78%.

EXAMPLE 6

A starting material was gasified using the same apparatus as set out in Example 5 and fed from the nozzle toward a substrate. The substrate temperature in the vicinity of the nozzle was 380° C. and the temperature in the vicinity of the exhaust port was set at 500° C. The thickness of the resultant film was about 5000 angstroms, and a diffraction peak of the (200) plane of $SnO_2$ was observed. The specific resistance was $5 \times 10^{-4}$ $\Omega \cdot cm$ and the overall transmittance was 78%.

COMPARATIVE EXAMPLE

The general procedure of Example 1 was repeated except that the substrate temperature was invariably maintained at 400° C. and the transparent conductive film was formed in a thickness of 5000 angstroms. The thus formed $SnO_2$ film had a specific resistance of $1.2 \times 10^{-3}$ $\Omega \cdot cm$ and an overall transmittance of 73%.

As a result of the X-ray diffraction analysis, only a diffraction peak of the (200) plane of $SnO_2$ was observed.

In Examples 1 to 4, there are shown the cases where a transparent conductive film is formed at a first substrate temperature, after which the feed of the atomized solution is stopped and the substrate temperature is increased. Thereafter, the atomized solution is again fed thereby forming another transparent conductive film on the first-mentioned film. In the industrial formation of the film, it is convenient to adopt the tunnel furnace system in consideration of the productivity. In this case, it has been confirmed that the temperature of the substrate is maintained at a given level to form a film, after which, a film can be formed while the temperature is continuously increased. Although the difference in substrate temperature between the initial stage of film formation and the last stage of the film formation is as being in the range of 80 to 130° C., no limitation is placed on the temperature difference. For instance, when a relatively higher temperature than the temperature in the initial stage of the film formation is used in the latter stage of the film formation, the invention can be effectively carried out.

In the foregoing examples, tin oxide is used as a metal oxide film. The method of the invention is readily carried out to form an $In_2O_3$ film from starting material $InCl_3 \cdot 4H_2O$, $SnCl_4 \cdot 5H_2O$ and $H_2O$ and also to form a $TiO_2$ film from starting $TiClhd 4$, $H_2O$ and $CH_3OH$.

As will be apparent from the foregoing, a metal oxide film having good characteristics and a high degree of orientation can be readily formed without severe control of film forming conditions. For instance, when tin oxide is used, the resultant film has a low specific resistance, a good light transmittance and a good degree of orientation, and can enhance the effect of confining light in its film as a result of the photoelectric conversion action. When this film is applied as a transparent electrode of a solar cell, the cell characteristics are significantly improved.

Although the invention has been described in its preferred form with a certain degree of particularity, it is to be understood that many variations and changes are possible in the invention without departing from the scope thereof.

What is claimed is:

1. A method of forming a transparent conductive metal oxide film with a textured surface on a substrate comprising the steps of contacting a heated substrate at a first temperature with an atomized or gasified metal-containing coating composition to form a coated substrate with a first metal oxide film deposited thereon; heating said coated substrate to a second temperature higher than said first temperature so that a second metal oxide film having a degree of crystal orientation in conformity with that of the first metal oxide film can be formed thereon; and contacting said coated substrate with the atomized or gasified metal-containing coating composition to deposit the second metal oxide film thereon, said second metal oxide film being of the same composition as said first metal oxide film.

2. A method according to claim 1, wherein the substrate is a soda lime glass substrate.

3. A method according to claim 1, wherein the metal containing coating composition is an atomized solution.

4. A method according to claim 3, wherein the first temperature of the substrate is in the range of from 350 to 450° C.

5. A method according to claim 1, wherein the metal-containing coating composition is a gasified material.

6. A method according to claim 5, wherein the first temperature of the substrate is in the range of from 350 to 420° C.

7. A method according to claim 1, wherein said metal is tin.

8. A method according to claim 1, wherein said metal is indium.

9. A method according to claim 1, wherein said metal is titanium.

10. A method according to claim 1, wherein said second temperature is about 530° C.

11. A method according to claim 1, wherein the difference between the first temperature and the second temperature is in the range of 80 to 130° C.

* * * * *